United States Patent
Ide

(10) Patent No.: US 8,753,977 B2
(45) Date of Patent: Jun. 17, 2014

(54) METHOD FOR MANUFACTURING SEMICONDUCTOR DEVICE AND SEMICONDUCTOR DEVICE

(71) Applicant: Kabushiki Kaisha Tochiba, Minato-ku (JP)

(72) Inventor: Kenichi Ide, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/084,307

(22) Filed: Nov. 19, 2013

(65) Prior Publication Data

US 2014/0141620 A1 May 22, 2014

Related U.S. Application Data

(62) Division of application No. 13/233,122, filed on Sep. 15, 2011, now Pat. No. 8,617,979.

(30) Foreign Application Priority Data

Feb. 18, 2011 (JP) .................. 2011-033003

(51) Int. Cl.
*H01L 21/4763* (2006.01)

(52) U.S. Cl.
USPC .......... 438/637; 438/622; 438/633; 438/634; 438/672; 438/675

(58) Field of Classification Search
CPC .............. H01L 21/02063; H01L 21/76805; H01L 21/76843
See application file for complete search history.

(56) References Cited

U.S. PATENT DOCUMENTS

2002/0153554 A1* 10/2002 Kajita et al. .................. 257/306

FOREIGN PATENT DOCUMENTS

| JP | 2005-114853 | 4/2005 |
| JP | 2007-324332 | 12/2007 |

* cited by examiner

*Primary Examiner* — Kyoung Lee
(74) *Attorney, Agent, or Firm* — Oblon, Spivak, McClelland, Maier & Neustadt, L.L.P.

(57) ABSTRACT

A method for manufacturing a semiconductor device includes dry etching an interlayer insulating layer provided on a foundation layer by using a mask having a plurality of first openings and a plurality of second openings arranged more closely than the first openings to form simultaneously a first hole reaching the foundation layer under each of the first openings and a second hole reaching the foundation layer under the second openings. The first hole reaches the foundation layer without contacting any other first holes. After starting of the dry etching, a plurality of holes are formed under each of the plurality of second openings, and with the progress of the dry etching, the plurality of holes are connected with each other at least at their upper parts including their open ends to form the second hole having an opening area larger than an opening area of the first hole.

11 Claims, 5 Drawing Sheets

METHOD FOR MANUFACTURING SEMICONDUCTOR DEVICE AND SEMICONDUCTOR DEVICE

CROSS-REFERENCE TO RELATED APPLICATION

This application is a division of and claims the benefit of priority under 35 U.S.C. §120 from U.S. Ser. No. 13/233,122 filed Sep. 15, 2011, and claims the benefit of priority under 35 U.S.C. §119 from Japanese Patent Application No. 2011-033003 filed Feb. 18, 2011; the entire contents of each of are incorporated herein by reference.

FIELD

Embodiments described herein relate generally to a method for manufacturing a semiconductor device and a semiconductor device.

BACKGROUND

In simultaneously forming a plurality of contact holes to connect an upper layer and a lower layer in a semiconductor device by dry etching, the holes having a relatively smaller opening area are likely to relatively lower etching rate, which easily causes insufficient etching. This may lead to the increase in contact resistance. In contrast, the holes having a relatively larger opening area are likely to relatively increase etching rate, which easily causes overetching. This may cause an element (e.g., a substrate) lower than the layer which is a target to be connected with the upper layer to be short-circuited with the upper layer.

DETAILED DESCRIPTION

Figure 1A:
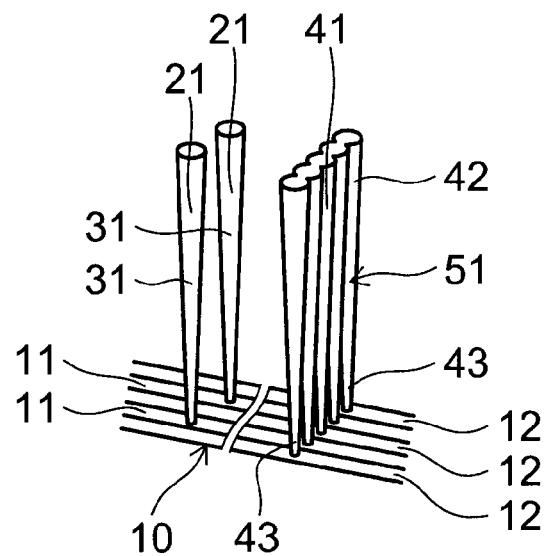
FIG. 1A is a schematic perspective view of a contact plug in an embodiment.

According to one embodiment, a method is disclosed for manufacturing a semiconductor device. The method can includes dry etching an interlayer insulating layer provided on a foundation layer by using a mask having a plurality of first openings and a plurality of second openings arranged more closely than the first openings to form simultaneously a first hole reaching the foundation layer under each of the first openings and a second hole reaching the foundation layer under the second openings. The first hole reaches the foundation layer without contacting any other first holes. After starting of the dry etching, a plurality of holes are formed under each of the plurality of second openings, and with the progress of the dry etching, the plurality of holes are connected with each other at least at their upper parts including their open ends to form the second hole having an opening area larger than an opening area of the first hole.

The Embodiment will now be described with reference to the drawings. In the drawings, similar components are marked with like reference numerals.

Figure 1B:
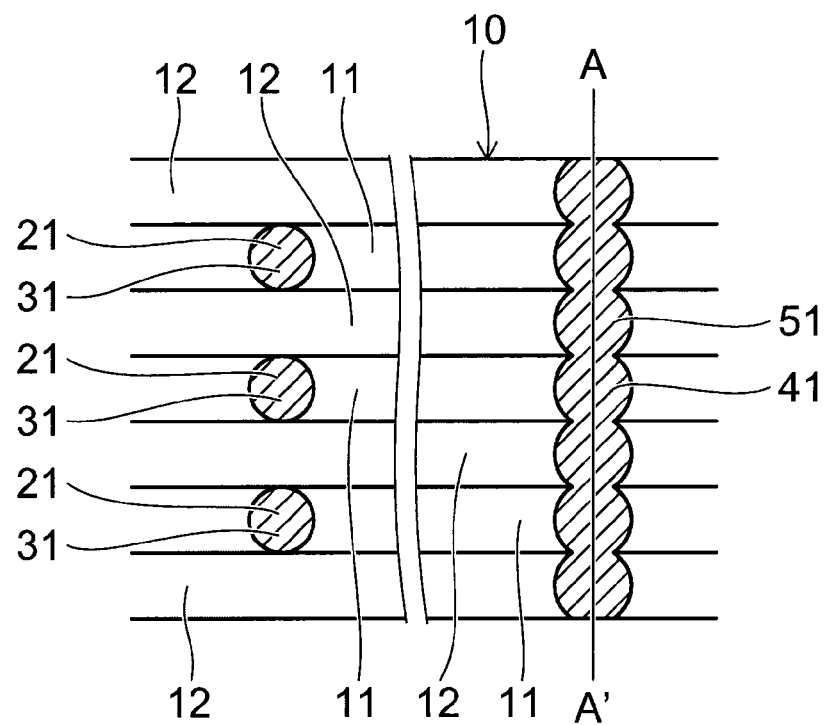
FIG. 1B is a schematic top view of the contact plug.

FIG. 1A is a schematic perspective view of a first contact plug 31 and a second contact plug 51 in the semiconductor device of the embodiment, and FIG. 1B is a schematic top view of the first contact plug 31 and the second contact plug 51.

In FIGS. 1A and 1B, diagrammatic representation of the interlayer insulating layer in which the first contact plug 31 and the second contact plug 51 have been formed is omitted.

The first contact plug 31 and the second contact plug 51 connect the foundation layer 10 and the upper layer wiring described below. The foundation layer 10 includes a plurality of semiconductor layers 11 and a plurality of insulating layers 12. The plurality of semiconductor layers 11 and the plurality of insulating layers 12 are formed on a substrate, for example, in striped plane patterns.

The first contact plug 31 is made of metal provided in the first contact hole 21. There are formed plural first contact holes 21, and each of the first contact holes 21 reaches one of the semiconductor layers 11. That is, each of the first contact plugs 31 is connected in a one-to-one correspondence to one of the semiconductor layers 11.

The plurality of first contact holes 21 and the plurality of first contact plugs 31 are arranged in the direction where the plurality of semiconductor layers 11 are arrayed repeatedly (i.e. in the vertical direction on FIG. 1B). The neighboring first contact plugs 31 are not in contact with each other. That is, each one of the first contact plugs 31 is a contact plug isolated electrically and not in contact with any other first contact plugs 31.

The second contact plug 51 is made of metal provided in the second contact hole 41.

Figure 4A:
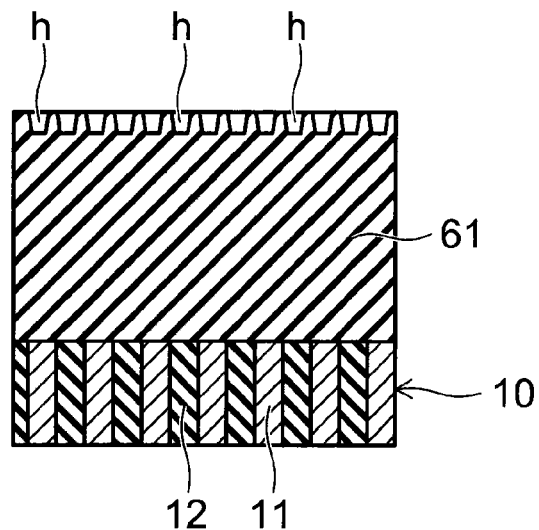
FIGS. 4A to 4C are schematic cross-sectional views illustrating a method for forming the contact hole in the embodiment.
Figure 4B:
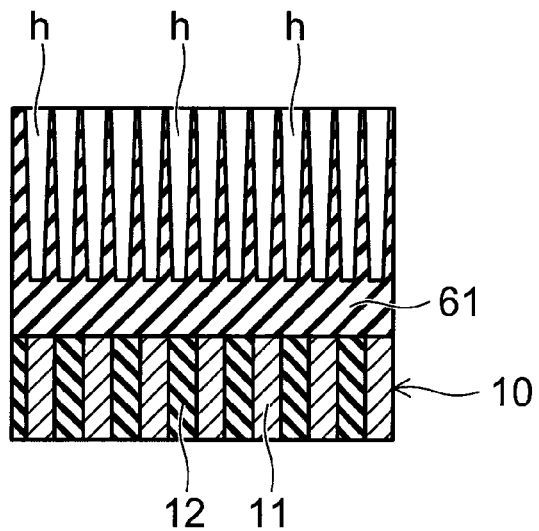
Figure 4C:
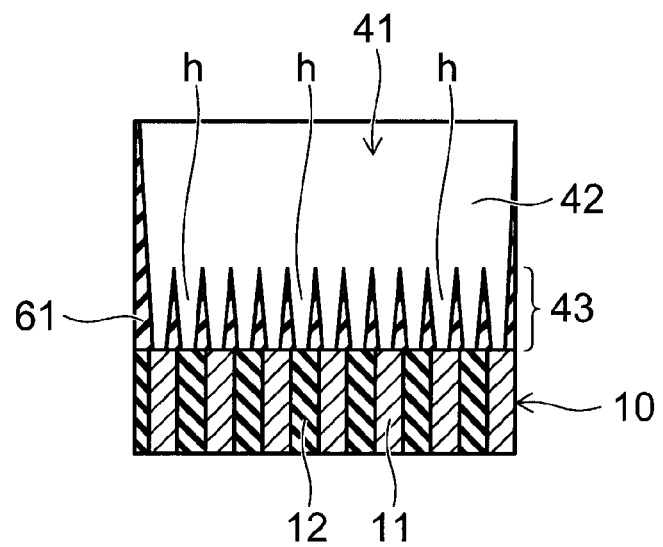

FIG. 4C illustrates a cross-sectional view of the second contact hole 41. FIG. 4C corresponds to a cross-section taken along the line A-A' in FIG. 1B.

The second contact hole 41 has an upper part 42 including an opening end and a lower part 43 reaching the foundation layer 10.

The opening end of the second contact hole 41 extends continuously in the direction where the plurality of semiconductor layers 11 are arrayed repeatedly (in the vertical direction in FIG. 1B.). An opening area of the second contact hole 41 is larger than an opening area of one of the first contact holes 21. The upper part 42, as shown in FIG. 4C, extends continuously in the direction where the plurality of semiconductor layers 11 are arrayed repeatedly.

As shown in FIG. 4C, the lower part 43 includes a plurality of holes h. Each of the plurality of holes h is connected in common to the upper part 42 and is diverged from the upper part 42 to reach the foundation layer 10. That is, a cross-section of the second contact hole 41 is formed in a comb shape.

Lower end of one of the holes h reaches the semiconductor layer 11 or the insulating layer 12. At least one of the holes h reaches one of the semiconductor layers 11. The plurality of holes h are integrated with the upper part 42. The second contact plug 51 is provided on both insides of the upper part 42 and the lower part 43. Therefore, the second contact plug 51 is connected, through the portion which is provided in the plurality of holes h, to the plurality of semiconductor layers 11.

Not only a structure in which one of the holes h extends to one of the semiconductor layers 11, but also a structure in which the plurality of holes h reach one of the semiconductor layers 11 is acceptable. Furthermore, a number of the holes h reaching the insulating layer 12 may be either one or more than one.

Figure 2:
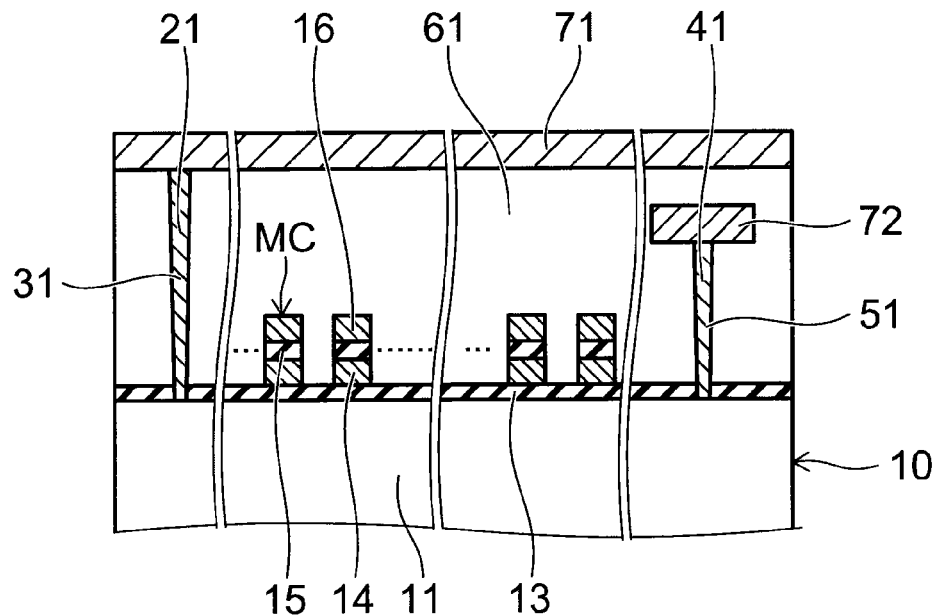
FIG. 2 is a schematic cross-sectional view of a semiconductor device in the embodiment.

An example of the semiconductor device of the embodiment having the first contact plug 31 and the second contact plug 51 is shown in FIG. 2. FIG. 2 illustrates a cross-section of the semiconductor layer 11 in the foundation layer 10 and upper layers on the semiconductor layer 11.

An active region including an impurity diffusion region (not shown) is formed on a surface of the semiconductor layer 11. On the surface of the semiconductor layer 11, a tunnel insulating film 13 is provided.

A floating gate 14 is provided on the tunnel insulating film 13. An interlayer insulating film 15 is provided on the floating gate 14. A control gate 16 is provided on the interlayer insulating film 15.

The floating gate 14, the interlayer instating film 15 and the control gate 16 are separated into plural parts in the direction to which the semiconductor layer 11 extends (i.e. in the horizontal direction in FIG. 2). The floating gate 14 is also separated into plural parts also in the direction intersecting the direction to which the semiconductor layers 11 extends. The interlayer instating film 15 and the control gate 16 extend in the direction intersecting the direction to which the semiconductor layers 11 extends.

The floating gate 14 is located at an intersection of the control gate 16 and the semiconductor layers 11. That is, a plurality of memory cells MC are arranged in a matrix in a plan view. One memory cell MC includes a floating gate 14 surrounded by an insulator.

The floating gate 14 is covered with the insulator and is not electrically connected to anywhere. Accordingly, even if turning off power, electrons stored in the floating gate 14 do not leak from nor newly enter the floating gate 14. That is, the semiconductor device illustrated in FIG. 2 is a nonvolatile semiconductor memory device which can hold data without supplying power.

On the tunnel insulating film 13, an interlayer insulating layer 61 is provided so as to cover the memory cells MC.

The plurality of memory cells MC are series-connected through the active region of the surface of the semiconductor layers 11 in the direction to which the semiconductor layers 11 extends to configure a column of cells. In addition, select gate transistors (not shown) are connected to the both ends of the column of cells. The column of cells and the select gate transistors are series-connected between a bit-line 71 and a source line 72 to configure a memory string.

The bit line 71 as the first upper layer wiring and the source line 72 as the second upper layer wiring are provided above the foundation layer 10 via the interlayer insulating layer 61.

The plurality of bit lines 71 are provided corresponding to the plurality of semiconductor layers 11. Each of the bit lines 71 extends in the direction to which the semiconductor layers 11 extend. Each of the bit lines 71 is connected electrically to one of the semiconductor layers 11 via one of the first contact plugs 31.

The source line 72 is arranged across the plurality of semiconductor layers 11. Via the second contact plug 51, the plurality of semiconductor layers 11 are electrically connected to the common source line 72. The second contact plug 51 allows different columns of cells to connect with the source line 72. That is, among a plurality of memory strings, the second contact plug 51 and the source line 72 are shared.

Figure 6A:
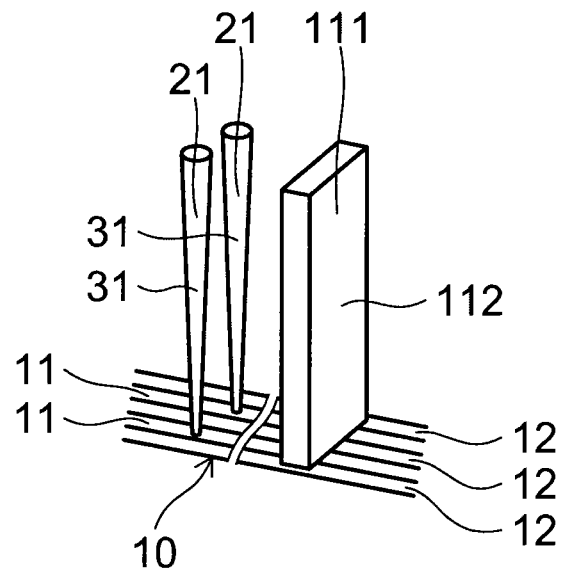
FIG. 6A is a schematic perspective view of a contact plug in a comparative example.

Here, FIG. 6A is a schematic perspective view of the first contact plug 31 and the second contact plug 112 in the semiconductor device of the comparative example.

In the comparative example, the second contact hole 111 and the second contact plug 112 provided therein differ from those of the embodiment.

The second contact hole 111 is formed in a trench shape having a continuing rectangular cross-section from top to bottom. In contrast, the first contact holes 21 are holes having circular openings.

The first contact holes 21 are connected to one of the semiconductor layers 11. In contrast, the second contact hole 111 is formed across the plurality of semiconductor layers 11 and connected to the plurality of semiconductor layers 11. Therefore, the opening area of the second contact hole 111 is larger than the opening area of the first contact holes 21.

Figure 6B:
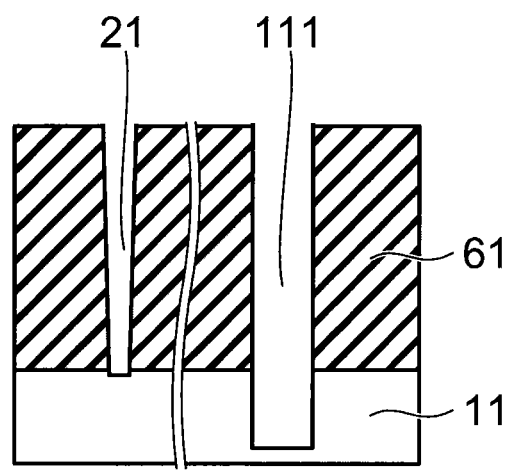
FIG. 6B is a schematic cross-sectional view of a contact hole in the comparative example.

When the plurality of contact holes 21 and 111 having such different opening shapes and opening areas are formed simultaneously by dry etching, the contact holes 21 having a relatively small opening area is likely to decrease its etching rate, which easily causes insufficient etching as shown in FIG. 6B. This may lead to the increase in contact resistance.

In contrast, the contact hole 111 having a relatively larger opening area is likely to increase its etching rate and, as shown in FIG. 6B, which easily causes overetching. This may cause the substrate, for example, lower than the semiconductor layer 11 which is a target to be connected with the upper layer wiring (e.g., the source line) to be short-circuited with the upper layer wiring.

Next, the method for forming the first contact holes 21 and the second contact hole 41 in the embodiment will be described.

After the plurality of semiconductor layers 11 and the plurality of insulating layers 12 are formed on the substrate in striped patterns, the interlayer insulating layer 61 (shown in FIG. 4A) is formed on the plurality of semiconductor layers 11 and the plurality of insulating layers 12.

Then, a resist is applied onto the interlayer insulating layer 61 and is selectively exposed to light and developed. Thereby, a resist mask 80 shown in FIG. 3, having the plurality of first openings 81 and the plurality of second openings 82, is formed on the interlayer insulating layer 61.

Each of the first openings 81 is located on each of the semiconductor layers 11 formed in striped patterns under the interlayer insulating layer 61. In addition, on one of the semiconductor layers 11, at least one of the second openings 82 is located via the interlayer insulating layer 61.

Both of the first openings 81 and the second openings 82 are linearly arranged in a direction crossing the plurality of semiconductor layers 11. The second openings 82 are arranged more closely than the first openings 81. The distance between the second openings 82 is smaller than the distance between the first openings 81. The second openings 82 are not in contact with each other, but each of the second openings 82 are formed as individual openings.

Both of the first openings 81 and the second openings 82 are formed in a circle. The opening area of the first openings 81 is the same as the opening area of the second openings 82. The term "same" used herein is not limited to being exactly the same, and encompasses the case where both openings are formed so as to have substantially the same opening area, including the case of mere manufacturing variations caused at the time of forming the resist mask 80.

Alternatively, the opening area of the first openings 81 and the opening area of the second openings 82 may differ within the range in which the difference in the etching rate is not caused to the extent of raising the problems described above.

Subsequently, the resist mask 80 is used as an etching mask to dry etch the interlayer insulating layer 61.

Figure 5:
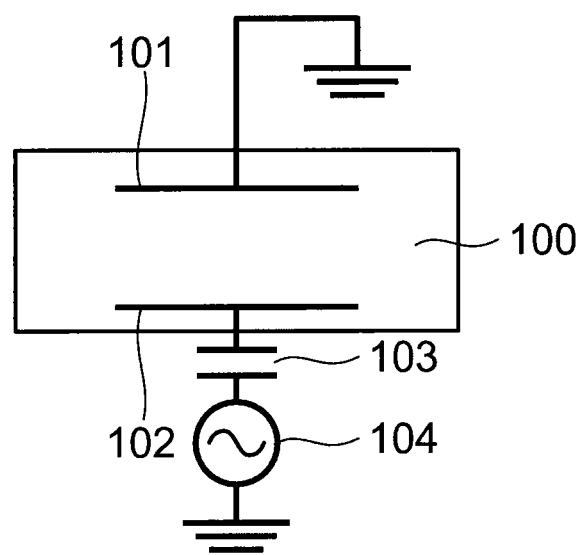
FIG. 5 is a schematic view of an etching equipment.

FIG. 5 is a schematic view of, for example, a parallel plate type etching equipment used for the dry etching process.

An upper electrode 101 and a lower electrode 102 are provided by facing each other in a processing chamber 100. The upper electrode 101 is grounded. The lower electrode 102 is connected, via a capacitor 103, to a high-frequency power source 104.

Into the processing chamber 100, etching gas is introduced through a gas supply system (not shown). Moreover, the pressure in the processing chamber 100 is reduced via an exhaust system (not shown). That is, the inside of the processing chamber 100 can be regulated to the reduced-pressure atmosphere of the intended gas.

A wafer including a stacked body of the aforementioned foundation layer 10, the interlayer insulating layer 61 and the resist mask 80 is held via a holding member (not shown) on the lower electrode 102. Then, the etching gas is introduced into the processing chamber 100, and a high-frequency voltage is applied to the lower electrode 102.

Then, a plasma containing any radicals and ions is generated in the processing chamber 100, and the interlayer insulating layer 61 is etched by the radicals and ions. The first contact hole 21 is formed under the first opening 81, and the second contact hole 41 is formed under the second opening 82. The plurality of first contact holes 21 and the second contact hole 41 are formed simultaneously.

After starting of the etching, first, a portion exposed to the first opening 81 in the interlayer insulating layer 61 and a portion exposed to the second opening 82 in the interlayer insulating layer 61 are etched. The etching proceeds predominantly in the depth direction of the interlayer insulating layer 61. In addition, the etching slightly proceeds also in the lateral direction or width direction (i.e. diametrical direction both of the first opening 81 and the second opening 82).

Figure 3:
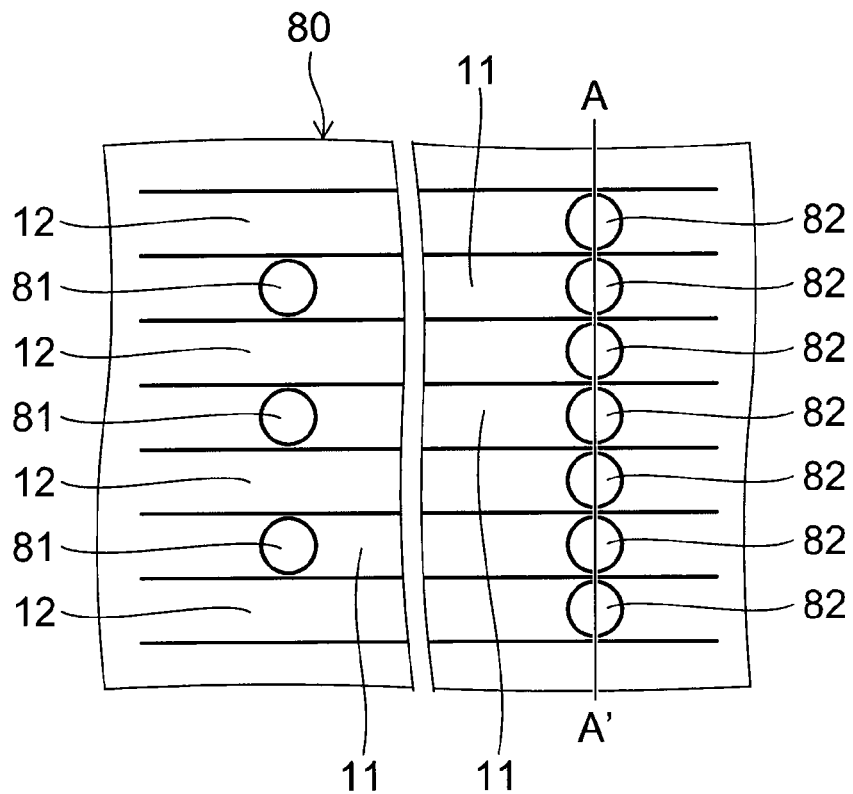
FIG. 3 is a schematic top view of a mask for forming a contact hole in the embodiment.

Therefore, the opening end of the first contact hole 21 shown in FIG. 1B becomes slightly larger than the first opening 81 in the resist mask 80 shown in FIG. 3. However, since the distance between the plurality of first openings 81 is sufficiently large, the first contact holes 21 are not connected with each other. That is, each of the first contact holes 21 reaches the corresponding semiconductor layer 11 as an individual hole, respectively.

Next, the formation of the second contact hole 41 will be described with reference to FIGS. 4A to 4C. While FIGS. 4A to 4C correspond to cross-sectional views taken along the line A-A' in FIG. 3, diagrammatic representation of the resist mask 80 is omitted.

After starting of the etching, first, a portion exposed to the second opening 82 in the interlayer insulating layer 61 is etched, and, as shown in FIG. 4A, the plurality of holes h are formed in the shallow position on the side of the second opening 82 in the interlayer insulating layer 61. At this stage, each of the plurality of holes h is formed as an individual hole without being connected with the other holes.

Then, with the progress of the etching, the depth of each hole h becomes larger as shown in FIG. 4B. While the etching mainly proceeds in the depth direction, the etching slightly proceeds in the lateral direction (i.e. width direction). Therefore, the upper part of the hole h at which the etching time relatively becomes longer keeps expanding the hole diameter.

And, since the second openings 82 in the resist mask 80 shown in FIG. 3 are arranged close to each other, the plurality of holes h becomes connected with each other at the upper part 42 including an opening end, as shown in FIG. 4C, when the etching further proceeds.

As shown in FIG. 1B, the opening end of the second contact hole 41 has a shape in such a way that the holes h formed under the plurality of second openings 82 during the earlier stage of the etching process, respectively, have been connected with each other in the form of being strung together like beads.

And, a lower end of the each hole h finally reaches the foundation layer 10. Therefore, the second contact hole 41, having a comb-shaped cross section, and having the upper part 42 and the lower part 43, are formed. The upper part 42 is connected in the array direction of the plurality of second openings 82. The lower part 43 includes the plurality of holes h which are separated from the upper part 42 to reach the foundation layer 10.

On the resist mask 80, the plurality of second openings 82 are not connected, and each of the second openings 82 is formed as an individual opening which is the same or approximately the same in size as the first openings 81. Therefore, when simultaneously performing etching under the first openings 81 and under the second openings 82, the difference in the etching rate, caused by the difference in the opening area between the first openings 81 and the second openings 82, can be suppressed.

As a result, the increase in contact resistance caused by insufficient etching, and a short circuit between the layers which are not targets to be connected, caused by overetching can be prevented.

Furthermore, etching process is controlled in such a way that the plurality of holes h formed under the second openings 82 during at least the early stage of the etching are connected with each other with the progress of the etching. Thereby, for the second contact hole 41, at least the upper part 42 including the opening end can be formed in an integrated manner in the direction crossing the plurality of semiconductor layers 11 to connect the second contact hole 41 all together with the plurality of semiconductor layers 11.

For instance, the interlayer insulating layer 61 mainly contains silicon oxide. The interlayer insulating layer 61 is etched by using, for example, a fluorocarbon-based (such as $CF_4$, $C_4F_8$, $C_4F_6$ or $CHF_3$) gas, argon (Ar) gas and oxygen ($O_2$) gas. For the fluorocarbon-based gas, when a proportion of fluoride (F) is increased, the hole diameter of the holes h is easily expanded, and conversely, when a proportion of carbon (C) is increased, the hole diameter of the holes h is difficult to be expanded.

Moreover, at the time of the etching, by applying a relatively low-frequency voltage such as 2 to 3.2 MHz to the lower electrode 102 shown in FIG. 5, the hole diameter of the holes h formed under the second opening 82 is easily enlarged and the upper part 42 in which the holes h are connected with each other is easily formed.

Furthermore, by controlling a ratio of the etching rate in the lateral direction relative to the etching rate in the depth direction to be in the range of one hundredth to one thirtieth, without connecting the first contact holes with each other, the holes h in the second contact hole 41 can be connected with each other.

However, depending on etching conditions, the plurality of holes h of the lower part 43 shown in FIG. 4C may also be connected with each other and lead to the second contact hole 41 connected in a trench shape from top to bottom. Even in such case, since the second openings 82 formed in the resist mask 80 are not connected with each other, the large difference in the etching rate caused by the difference between the opening area of the first opening 81 and the opening area of the second opening 82 can be suppressed.

After forming the first contact holes 21 and the second contact hole 41, metal is buried in the first contact holes 21 and the second contact hole 41. Thereby, the first contact plugs 31 and the second contact plug 51 can be obtained.

The first contact plugs 31 are not in contact with any other first contact plugs 31 and each individually connect one of the semiconductor layers 11 and one of the upper layer wirings (e.g., the bit lines 71 shown in FIG. 2).

The second contact plug 51 is formed in the same comb-shaped cross-sectional shape as the cross-sectional shape of the second contact hole 41 shown in FIG. 4C, and connects the plurality of semiconductor layers 11 to the common upper layer wiring (e.g., the source line 72 shown in FIG. 2)

The opening of the second contact hole 41 is formed in the trench shape obtained by being connected with the plurality of openings of the first contact holes 21, and the opening area of the second contact hole 41 is larger than the opening area of the first contact holes 21. According to the embodiment described above, two types of the contact holes 21, 41 having such a large difference in the opening area can be formed simultaneously without causing a large difference in the etching rate.

That is, among the openings which expose the etching target, the etching mask having the same opening areas or a small difference in opening areas is used, and conditions are set under which the hole diameter of at least the upper part of the second contact hole 41 is enlarged with the progress of the etching. Therefore, by suppressing the overetching of the second contact hole 41 which finally form the opening in, for example, the trench shape, as well as by suppressing the insufficient etching of the first contact holes 21 having the circular openings which are smaller than the opening of the second contact hole 41, these two types of contact holes 21 and 41 can be formed simultaneously.

The configuration of the foundation layer 10 and the layout of the semiconductor layer 11 are not limited to those illustrated in the embodiment described above. Furthermore, the planar layout of the first contact plugs 31 and the second contact plug 51 is not also limited to those shown in FIG. 1B. Moreover, the targets to be connected with the first contact plugs 31 and the second contact plug 51 are not limited to the foundation layer, the bit line and the source line illustrated in the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:
   dry etching an interlayer insulating layer provided on a foundation layer by using a mask having a plurality of first openings and a plurality of second openings arranged more closely than the first openings to form simultaneously a first hole reaching the foundation layer under each of the first openings and a second hole reaching the foundation layer under the second openings,
   the first hole reaching the foundation layer without contacting any other first holes,
   after starting of the dry etching, a plurality of holes being formed under each of the plurality of second openings, and with the progress of the dry etching, the plurality of holes being connected with each other at least at their upper parts including their open ends to form the second hole having an opening area larger than an opening area of the first hole.

2. The method according to claim 1, wherein an opening area of the first opening formed in the mask and an opening area of the second opening formed in the mask are substantially the same.

3. The method according to claim 1, wherein the foundation layer includes a plurality of semiconductor layers formed in striped patterns and a plurality of insulating layers, each of which formed in striped patterns between the neighboring semiconductor layers.

4. The method according to claim 3, wherein each of the first openings is located on each of the semiconductor layers via the interlayer insulating layer.

5. The method according to claim 3, wherein at least one of the second openings is located on one of the semiconductor layers via the interlayer insulating layer.

6. The method according to claim 5, wherein at least one of the second openings is located on one of the insulating layers via the interlayer insulating layer.

7. The method according to claim 3, wherein both of the plurality of first openings and the plurality of second openings are arranged in a direction crossing the plurality of semiconductor layers.

8. The method according to claim 1, wherein the interlayer insulating layer mainly containing silicon oxide is etched by using a fluorocarbon-based gas.

9. The method according to claim 1, wherein
   a wafer including a stacked body of the foundation layer, the interlayer insulating layer and the mask is held on a lower electrode in a processing chamber in which a grounded upper electrode and the lower electrode facing the upper electrode are provided;
   an etching gas is introduced into the processing chamber; and
   a voltage is applied to the lower electrode to etch the interlayer insulating layer.

10. The method according to claim 9, wherein the voltage having frequency of 2 to 3.2 MHz is applied to the lower electrode.

11. The method according to claim 1, wherein an etching rate in a diametrical direction relative to an etching rate in a depth direction of the second hole is controlled to be in the range of one hundredth to one thirtieth.

* * * * *